United States Patent [19]

Eichelberger et al.

[11] 4,404,237

[45] Sep. 13, 1983

[54] FABRICATION OF ELECTRICAL CONDUCTOR BY REPLACEMENT OF METALLIC POWDER IN POLYMER WITH MORE NOBLE METAL

[75] Inventors: Charles W. Eichelberger, Schenectady; Robert J. Wojnarowski, Clifton Park, both of N.Y.

[73] Assignee: General Electric Company, Schenectady, N.Y.

[21] Appl. No.: 220,342

[22] Filed: Dec. 29, 1980

[51] Int. Cl.³ .......................... H05K 3/12; H05K 3/18
[52] U.S. Cl. ...................................... 427/96; 427/98; 427/101; 427/102; 427/103; 427/123; 427/205; 427/436
[58] Field of Search .................. 427/96, 98, 123, 205, 427/436, 101–103; 204/60, 30, 38

[56] References Cited

U.S. PATENT DOCUMENTS

| | | | |
|---|---|---|---|
| 3,226,256 | 12/1965 | Schweble | 427/98 |
| 3,332,860 | 7/1967 | Diebold | 204/38 B |
| 3,576,662 | 4/1971 | Diebold | 427/302 |
| 3,764,280 | 10/1973 | Lupinski | 427/229 |
| 3,801,364 | 4/1974 | Kojima | 427/98 |
| 4,284,665 | 8/1981 | Heimala et al. | 427/205 |

OTHER PUBLICATIONS

Krulik, "Electroless Plating of Plastics", Journal of Chemical Education, vol. 55, No. 6, Jun. 1978, p. 361.

Primary Examiner—John D. Smith
Attorney, Agent, or Firm—Geoffrey H. Krauss; James C. Davis, Jr.; Marvin Snyder

[57] ABSTRACT

A low-cost conductor, e.g. a printed circuit, is prepared by applying a mixture of a metallic powder and polymer on a substrate and curing the polymer, followed by an augmentation replacement reaction being effected to replace some of the metallic powder with a more noble metal in such a way that the total volume of deposited metal on the surface exceeds that of the original metal powder at that surface. This procedure produces contiguous layer of conducting metal on the substrate. The conductors thus formed can easily be soldered without leaching using a conventional tin-lead solders.

97 Claims, 4 Drawing Figures

FABRICATION OF ELECTRICAL CONDUCTOR BY REPLACEMENT OF METALLIC POWDER IN POLYMER WITH MORE NOBLE METAL

Related applications include application Ser. No. 220,331; 220,341; 220,343; 220,344; and 220,937, all filed Dec. 29, 1980 and application Ser. No. 220,332 having a filing date of Mar. 11, 1981.

BACKGROUND OF THE INVENTION

Many types of electronic apparatus are known in which the various electrical components are interconnected by electrical conductors. The interconnecting conductors are fabricated in a wide variety of processes such as, for example, thick-film fired conductor systems, polymer conductors and printed circuit boards.

In thick-film fired conductors, a mixture of a conducting metal powder, a ceramic or glass binder and an appropriate vehicle is screen printed on a substrate. The conductor pattern on the substrate is then fired at a relatively high temperature, typically between 650° and 900° C. As the temperature rises to the firing temperature, the vehicle is volatilized leaving the metal and binder behind. At the firing temperature, sintering of the metal takes place to a greater or lesser extent with the binder providing adhesion between the metal film formed and the substrate.

Thick-film fired conductors have classically employed precious metals such as gold, silver, platinum and palladium. Recently three noble metals have soared in cost, and new conductor systems using copper, nickel and aluminum are being made commercially available. The cost of the precious metal systems is prohibitive where a low cost conductor system is desired. The newer metal systems are not significantly cheaper because of the special chemistry which is required to prevent oxidation of the metal during the firing process. Moreover, these systems are very difficult to solder using the conventional tin/lead solder and the high firing temperatures required during fabrication preclude the use of low cost substrate materials. Some of the nickel system can be fired on soda-lime glass at temperatures just below the melting point of the glass but the resulting conductivity of the conductor is relatively low.

The term "polymer conductor" is actually a misnomer since the polymer is not actually a conductor. Instead, the polymer is heavily loaded with a conducting metal and screened on to a substrate. The advantage of this system is that the polymer can be cured either catalytically or thermally at temperatures which range from room temperature to about 125° C. As a result of this so called "cold processing", it is possible to use very inexpensive substrates such as films of MYLAR ®- (polyethylene terephthalate). The mechanism by which conductivity is achieved is supplied entirely by contact between individual metallic particles. It has been found that the only metals which can be loaded into the polymer and give acceptable conductivity are the precious metals such as gold and silver. All of the other standard conducting metals oxidize over a period of time and the conductivity between the particles is reduced. Silver has been the predominant choice in polymer conductor systems but the silver systems are generally not solderable because the silver is leached by the lead-tin solder. When the price of silver is about $10–11 per ounce, these conductor systems are competitive with other systems if used on very low cost substrates such as thin MYLAR films. However, when the price of silver is higher, the systems are not competitive with printed circuit boards.

The techniques used to prepare printed circuit boards can be divided into additive and subtractive technologies. In both, the starting point is a substrate, which can vary widely from phenolics to glass-filled epoxies, on which a copper foil is bonded. In the additive preparatory system, the copper foil is very thin, usually on the order of about 200 microinches. A resist is patterned such that the copper is exposed only where the conductors are desired and the board is then electroplated to form copper conductors of about 1 mil in thickness. The plating resist is stripped and the copper is etched. In areas where the conductor is not desired, the copper is only about 200 microinches thick so that etching quickly removes this copper while leaving a 1 mil thick conductor. In the subtractive process, the starting thickness of the copper foil is usually between 1 and 2 mils. An etch resist is deposited wherever the conductors are desired, the board is etched and the resist is then removed. The resist prevents etching where the conductors are desired leaving conductor runs.

Both the additive and subtractive printed circuit board procedures require the application of a copper foil over the entire substrate, deposition and removal of a resist, etching of the printed circuit board, drilling holes for component insertion, and in one case, the additional step of electroplating. An advantage of this technology is, however, that the resulting circuit boards can be relatively easily soldered.

Another advantage of the printed circuit board technology is that plated-through holes can be fabricated. This process usually involves the addition of several steps to the additive fabrication process. Holes are drilled in the substrate and thereafter the resist is applied over all areas except where the conductors are desired. The board is then soaked in a stannous chloride sensitizer which forms a coating over the exposed parts of the substrate, namely inside the holes. The board is then sequentially dipped in a bath of palladium chloride, acid to dissolve the tin chloride, and an electroless copper bath. The last step, i.e., immersion in an electroless copper bath, deposits a very thin film of copper inside the activated hole. This "electroless copper" is plated out by a catalytic reaction in which the catalyst is copper such that a continuous plating reaction can occur. Typically, thickness on the order of 24–50 microinches can be achieved in 0.5 hour. At this point, a thin film of copper is adhered to the inside edges of the holes. The subsequent electroplating will build up the thickness of the copper within the holes as well as along all of the conductor runs. At this point, the various processes employed differ. The simplest process merely strips the resist and then etches, eliminating the much thinner copper where the conductor runs are not desired. In more complex processes, electroplating of tin-lead solder is accomplished which results in a tin-lead solder inside the hole and along the conductor runs, followed by stripping the plating resist and etching with chromic acid, which does not attack the tin-lead solder so that the solder acts as an etch resist.

The most significant drawbacks of the printed circuit board technology is that a substantial number of processing steps are necessary and this requires a large amount of associated equipment. In addition, the choice of substrate materials is limited to one of those available for circuit board materials. The number of process steps and equipment results in relatively high processing costs and the limitation of the substrate materials eliminates the opportunity to use a decorative or structural member, which may already be required in the apparatus, as the substrate. Typical total costs for processed printed circuit boards range from $0.03 to $0.15 per square inch depending on the quality of the board, whether the board is single-sided or double-sided and whether plated-through holes are used.

When polymer resistors are printed directly on thick-film substrates or printed circuit boards, resistor termination problems occur where a junction to a thick film printed resistor is provided by overlapping the underlying conductor with the resistor pattern. The area of overlap provides the connection between the conductive pathway and the resistor, and if the underlying conductor is oxidized or the resistor material is incompatible with the underlying conductor, a poor termination is formed. This problem is especially prevalent when the resistors have low resistivity because the resistance of the interface can provide a substantial proportion of the total resistance. A further problem exists when it is desirable to cure the resistor at relatively high temperatures, such as 200° C. Under these conditions, the conductor surface is oxidized, making it considerably more difficult to obtain good solder wetting to the conductor during subsequent soldering cycles.

In thick-film circuits, the conventional method of attaching components to conductor runs of a circuit is by soldering. This requires that the substrate be dipped in a hot solder bath or that a solder/rosin paste be printed in the area where the solder is desired. The components to be connected are mounted on the surface of the substrate and the resulting structure is heated to the melting point of the solder to reflow the solder so as to connect the components to the conductors. This method, however, engenders several problems. A number of process steps are required to establish the solder in place before the part can be mounted and a reflow soldering step must still be undertaken. Also, problems result from the requirement that the temperature be above the melting point of the solder. In some systems, especially those using a plastic substrate, soldering temperatures on the order of 230° C. cannot be accommodated. Still another problem stems from the additional processing steps which are required to make component leads compatable with the soldering process, i.e., the leads must either be solder or gold plated. A typically used lead material is the alloy KOVAR ®, which has a relatively ideal coefficient of expansion but which is not solderable itself. In the case of solder dipping followed by reflow, it is necessary to use some form of jig to hold the components in place because the solder is hard and the components will not stick to its surface. Solder pastes overcome this problem somewhat but they are much more expensive. A further problem with the use of a solder system occurs when the coefficient of expansion of the component does not closely match that of the substrate; under these conditions, the solder connection can be broken as a result of the thermal stresses developed.

BRIEF SUMMARY OF THE INVENTION

In accordance with the invention, printed circuits and other conductive designs are prepared by applying the desired design on a substrate with an ink composition containing a finely divided metal powder composition, a curable polymer and a solvent, at least partially curing the curable polymer, contacting the resulting designed substrate with a metal salt solution in which the metal cation is more noble then the metal of the finely divided powder, such that the anion forms a salt with a portion of the metal powder composition and the cation metal plates out on the surface of the curable polymer. The invention also concerns the attachment of various components to the conductive pathways.

It is accordingly the object of this invention to provide a low-cost conductor system and method of fabrication which is simple to effect, in which each processing step is relatively fast, generally requiring less than 5 minutes, which permits batch handling as opposed to single piece handling and in which the waste materials generated are generally environmentally safe and do not require special disposal processing. Another object of the invention is to provide a conductor system which is compatible with a multiplicity of low cost substrate materials such as soda-lime glass, plastic and even paper.

Another object of the invention is to provide a conductor system which is compatible with a multiplicity of low-cost substrates, such as soda-lime glass, plastic, phenolic, coated steel and even paper.

Yet another object of the invention is to provide a conductor system compatible with conventional lead-tin soldering alloys.

A further object of the invention is to provide a conductor system which does not require the use of high temperatures and in which the baking requirements are not time and temperature critical.

A still further object of this invention is to provide a highly reliable method for terminating thick film polymer resistors and to prevent the high temperature curing steps, required for resistor curing, from oxidizing the conductor patterns.

A yet further object is to provide a low resistance connection to resistor systems and to permit resistors to be printed first with subsequent printing of conductors while still achieving a good low resistance termination.

Another object of the invention is to reduce the total number of processing steps and material required to achieve interconnection from conductor patterns to other components.

These and other objects of the invention will become apparent to those skilled in this art from the following detailed description, when read in conjunction with the drawings.

DETAILED DESCRIPTION OF THE INVENTION

Figure 1:
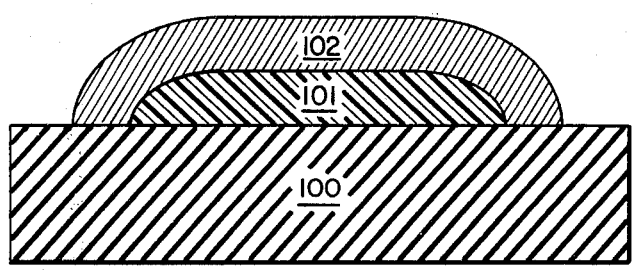
FIG. 1 is a cross-section of a conductive path of the invention.

The process of the present invention, in its broadest form, involves the establishment of the desired conductive pattern on a substrate by means of a metal-containing, cured polymer which is subjected to an augmentation replacement reaction. The process is particularly adapted for use of screen-printing techniques to establish the conductor patterns on the substrates, although the invention is not so limited. Other types of printing and application techniques can be used including, without limitation, pad flexographic printing, stencil, rotogravieur and offset printing.

The substrates on which the conductive patterns are formed are not restricted and any insulator to which the metal ink can be adhered is employable. Thus, the usual printed circuit substrates can be used, as well as glass-filled polyesters, phenolic boards, polystyrene and the like. Of particular interest as a substrate for use in the present invention is glass or steel covered with an insulator, such as porcelain or epoxy. The latter materials are often used as structural or decorative elements in many constructions and applying electronic elements directly to them provides advantages with respect to ease of fabrication, and cost.

The metal inks used in the present invention are a combination of a finely divided metal powder composition with a polymer whose viscosity and flow characteristics is controlled by the incorporation of a solvent therein. The metal can be any metal which is: stable in the ink and cured polymer; can be obtained in finely divided form; and is placed above the metal used in the augmentation replacement reaction in the activity series of the metals. Because of its availability and low cost, a presently preferred metal is iron. The metal powder generally has a particle size of less than about 50 microns, preferably 3 to about 25 microns and most preferably less than about 10 microns. When the ink is deposited by screen printing, the metal particles must be of a size to pass through the screen.

The polymers employed in the ink are any curable material or mixture thereof which exhibits a degree of adhesion to the substrate being employed and to the finely divided metal powder which is dispersed therein. Typical polymers which can be employed include the homopolymers and copolymers of ethylenically unsaturated aliphatic, alicyclic and aromatic hydrocarbons such as polyethylene, polypropylene, polybutene, ethylene propylene copolymers, copolymers of ethylene or propylene with other olefins, polybutadiene, polyisoprene, polystyrene and polymers of pentene, hexene, heptene, bicyclo(2,2,1)2-heptane, methyl styrene and the like. Other polymers which can be used include polyindene, polymers of acrylate esters and polymers of methacrylate esters, acrylate and methacrylate resins such as ethyl acrylate, n-butyl methacrylate, isobutyl methacrylate, ethyl methacrylate and methyl methacrylate; alkyd resins; cellulose derivatives such as cellulose acetate, cellulose acetate butyrate, cellulose nitrate, ethyl cellulose, hydroxyethyl cellulose, methyl cellulose, and sodium carboxymethyl cellulose; epoxy resins; hydrocarbon resins from petroleum; isobutylene resins; isocyanate resins (polyurethanes); melamine resins such as melamineformaldehyde and melamine-urea-formaldehyde; oleo-resins; polyamide polymers such as polyamides and polyamide-epoxy polyesters; polyester resins such as the unsaturated polyesters of dibasic acids and dihydroxy compounds, and associated monomers, such as styrene, triallylcyanurate, vinyltoluene, diallyphthalate, dicyclopentadieneacrylate; polyester elastomer and resorcinol resins such as resorcinolformaldehyde, resorcinol-furfural, resorcinol-phenolformaldehyde, and resorcinal-urea; rubbers such as natural rubber, reclaimed rubber, chlorinated rubber, butadiene styrene rubber, and butyl rubber, neoprene rubber, polysulfide, vinyl acetate and vinyl alconolacetate copolymers, polyvinyl alcohol, polyvinyl chloride, polyvinyl pyrollidone and polyvinylidene chloride, polycarbonates, graft copolymers of polymers of unsaturated hydrocarbons and of unsaturated monomers such as graft copolymers of polybutadiene, styrene and acrylonitrile, commonly called ABS resins, polyamides, polyimides and the like.

The polymers and inks of the present invention can contain various other materials such as fillers, e.g., glass fiber, glass powder, glass beads, asbestos, mineral fillers, wood flower and other vegetable fillers, dyes, pigments, waxes, stabilizers, lubricants, curing catalysts such as peroxides, photosensitizers and amines, polymerization inhibitors, wetting agents, adhesion promoters and the like. It is preferred, but not essential, to employ a polymer which exhibits a substantial degree of volumetric shrinkage upon curing.

The amounts of the finely divided metal and polymer are adjusted such that the metal constitutes about 60–80% by volume of the mixture after curing. Preferably, the metal is about 70% by volume. It is desired to have a significant amount of metal particles on the surface of the cured ink to facilitate the subsequent augmentation replacement reaction.

A solvent is used in the ink formulation in order to adjust the viscosity and flow characteristics for the type of printing desired. In general, the solvent should be employed in an amount sufficient that the ink has a viscosity of 15,000–200,000 cps at room temperature. Preferably, the viscosity will be about 50,000–150,000 cps. for screen printing usage. Suitable solvents or diluents can be aliphatic or aromatic and usually contain up to about 30 carbon atoms. They include the hydrocarbons, ethers and thioesthers, carbonyl compounds such as esters and ketones, nitrogen containing compounds such as amides, amines, nitriles and nitro compounds, alcohols, phenols, mercaptans and halogen containing compounds. Examples include alcohols such as methanol, ethanol, propanol, benxyl alcohol, cyclohexanol, ethylene glycol, glycerol and the like, aromatic materials such as benzene, toluene, xylene, ethyl benzene, naphthalene, tetralin and the like, ethers such as methyl ether, ethyl ether, propyl ether, methyl t-butyl ether, and the like, alkanes such as methane, ethane, propane and the like, dimethyl sulfoxide, butyl formate, methyl acetate, ethyl acetate, formamide, dimethyl formamide, acetamide, acetone, nitrobenzene, monochlorobenzene, acetophenone, tetrahydrofuran, chloroform, carbon tetrachloride, trichloroethylene, ethylbromide, phenol, mercaptophenol, and the like. Additionally, reactive solvents or diluents such as triallyl isocyanurate, dicyclopentadieneacrylate, phenylglycidal ether and the like, can be used if desired. It is preferred to employ a solvent which is relatively non-volatile at room temperature so that the viscosity and flow of the ink is appropriate during application to the substrate and highly volatile at the curing temperature of the polymer or at other temperatures above the application temperature. The carbitol series of solvents and particularly butyl carbitol (diethylene glycol monobutyl ether) has been found to be particularly appropriate.

The ink is applied to the substrate to achieve the desired conductor patterns thereon. For example, standard printed circuit application technology can be employed. Any temperature which will not cause premature curing of the ink and at which the viscosity and flow characteristics of the ink are appropriate to the application technique used can be employed. It is preferred, but not necessary, to permit at least a portion of the solvent to evaporate after application of the ink to the substrate and before curing. The act of evaporation exposes additional metal powder and increases the ratio of metal powder to polymer so as to achieve a balance between sufficient metal to provide a base for the conductive film to be formed thereon and too little polymer to act as a binder to hold the metal particles. Preferably, the drying is effected for 0.1–1 hour, more preferably about 0.25–0.5 hour, at a temperature of about 70°–150° C., most preferably about 110°–130° C.

In the next step in the instant process, the ink polymer is cured or polymerized by the most convenient method. If an autocatalyst has been added, the polymer will cure by itself with no additional initiation. In the case of ultraviolet light initiators, the substrates carrying the conductor patterns can be passed under a high intensity ultraviolet source which causes the initiators to begin the curing reaction. It is presently preferred to employ a thermal curing system which is activated by exposure to temperatures of about 140°–200° C., preferably about 150°–180° C., for a time of 0.1–1 hour, preferably 0.15–0.5 hour. As a result of this step, a closely compacted metal powder bound to the substrate by the cured polymer is achieved. Because of the high percentage of metal and shrinkage of the polymer chosen, the conductive pattern thus obtained may have some conductivity due to physical contact between the metal particles. In the preferred embodiment of this invention that conductivity is on the order of about 30 Kohm per square for a one mil thick deposit. The resistance will be highly variable and increase substantially if the system is subjected to oxidizing conditions for any period of time since an oxide builds up between particles and reduces conductivity.

In some instances, it may be desirable to only partially cure the polymer. For example, as described below, occasions arise where it is desirable to mount components by inserting the leads thereof in the polymer ink. In such instances, it may be desirable to partially cure the polymer, or only gel the polymer in situations where the polymer employed is gelable, so as to provide an adhesive for the lead wire.

The ink-designed substrate is subjected to an augmentation replacement reaction in which some of the metal of the powder is replaced by a metal further down in the activity series, i.e., which is more noble. This step takes advantage of the known chemical behavior of metals, i.e., that any metal will displace any succeeding, less active, metal from a water solution of one of its salts. However, in this invention, it has been found that while the powder metal enters into solution from the surface and somewhat below the surface of the polymer, the plating out of the more-noble metal takes place, to a large extent, on the surface. Thus, an additional amount of noble metal is deposited on the surface than that which would form a one-to-one exchange with the powder metal at the surface. The additional metal from the solution plates to both the original and replacement metal particles which are adhered to the substrate by the polymer, to interconnect all metal particles at the surface and thus form a contiguous film of conductive metal over the printed conductor pattern. It has been found that several hundred microinches of conductor material can be built up from a solution in a period of 5 minutes.

The augmentation reaction reagent is a solution, preferably inorganic and most preferably aqueous, of a metal salt. The cation of the metal salt is any more noble or electropositive metal than the metal of the finely divided powder, i.e., lies below the powder metal in the activity series, and which is electrically conductive. Any anion can be used which is relatively inert, i.e., does not deleteriously affect the process and which forms soluble salts with both the cation metal and the powder metal. Typical salts include copper nitrate, copper acetate, copper fluoroborate, potassium gold cyanide, nickel sulfate, nickel chloride, nickel sulfamate, potassium silver cyanide, silver chloride and the like. One presently preferred metal salt is copper sulfate. The concentration of the metal salt in the solution can range from 0.1 molar to saturation but is preferably about 0.5–2.0 molar. Below about 0.5 molar, deposition rates are inordinately slow and there is no improvement in rate at molarities above 2.0. Most preferably, the metal salt is present at a concentration of about 1 molar.

When copper sulfate is used as the augmentation metal, a copper layer is formed; this layer is of new unoxidized copper, which can be readily soldered. If further enhancement is desired or if soldering of the circuits is to be delayed for a substantial period of time, the conductor pattern formed can be dipped in a tin plating solution so that the tin will replace some of the copper. Tin and copper are very close in the activity series and the normal replacement reaction would cause copper to be plated out on the tin. However, by adding appropriate complexing ions, the tin will replace the copper. The tin-plated copper thus formed is very readily soldered and can be left for periods of a month or more and good soldering can still be achieved. Suitable tin plating solutions are commercially available for plating on copper such as, for example, Coppertech Electroless Tin Plating Solution ST-210 or ST-240. The augmentation reaction can be carried out at any suitable temperature although elevated temperatures are generally preferred in order to increase reaction rate. Thus, any temperature from ambient up to about 100° C. can be employed although the temperature is preferably about 45°–60° C. Generally the augmentation reaction is completed in about 2–20 minutes or more, preferably about 5 minutes.

FIG. 1 is a cross-section of a substrate carrying a conductive pathway in accordance with the present invention. Substrate 100 carries a layer of cured ink 101 over a portion of its surface. The conductive layer of metal achieved by the augmentation replacement reaction is shown as 102.

There are occasions when the adhesion of the newly plated solution metal to the powder metal surface may be less than desired. For example, adhesion is generally adequate if the area is to be a conductive pathway but increased adhesion is desired if connections or mounting is to take place. The reason is that the metal powder at the surface of the cured conductor ink pattern can become coated with a contaminate such as oxides or oils which will prevent good adhesion. Additionally, portions of the polymeric binder material may overlie the powder metal and interfere with proper adhesion. On such occasions, adhesion can be increased by abrading the surface of the powder metal particles either before or simultaneously with contact with the augmentative replacement solution. In the case of simultaneous application, the abrasive will dislodge those areas where there is poorly adherent metal or contaminate or both, leaving a clean surface behind, and the augmentation reaction will then commence on the newly cleaned surfaces. In general, any non-reactive solid such as talc can be used as an abrasive. Powdered alumina and fine sea sand have been successfully used. One particularly interesting abrasive is anhydrous copper sulfate. If one employs an amount of anhydrous copper sulfate beyond that required for saturation, the excess will form a wet slurry which can be used as an abrasive and has the added property of supplying ions of copper for exchange and plating to the metal particles. Alternatively, a slurry of the abrasive and metal salt solution can be sprayed toward the conductor ink pattern. It should be noted that the abrading action need not be continuous in that the desired deposition can occur continuously with abrasive action taking place progressively over the substrate. Such action would be representative of mechanical rubbing systems, such as a roller. Moreover, there need not be any loss of the material except for that which is plated onto the substrate, i.e., the abrasive and metal ion solution which is sprayed or rubbed on the substrate can be recovered and reused.

Figure 2:
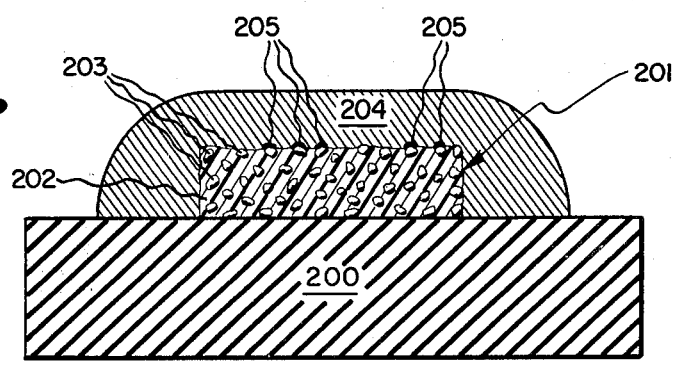
FIG. 2 is a cross-section of a second embodiment of a conductive path of the invention.

FIG. 2 shows a cross-section of a substrate 200 carrying a cured polymer ink 201 on a portion thereof. Ink 201 is composed of a polymeric binder 202 and metal particles 203. The conductive layer achieved by the augmentation replacement reaction is shown as 204. In this figure, the right hand side of layer 201 has been abraded so that metal particles 203 and conductive metal layer 204 directly and adhesively contact. On the left hand side, contaminate particles 205 which interfere with adhesion are evident.

It is often desirable to use zinc as the powder metal because of its very low cost and because zinc reacts readily with simple copper salt solutions. Unfortunately, the zinc reacts too vigorously resulting in a very porous and spongy copper film. Further, in some fabrication systems using iron powder, there is a moisture susceptibility problem because the iron has a tendency to rust. These problems can be avoided to a great extent by using a mixture of powdered metals.

One preferred powder metal mixture contains: about 15–45% zinc, preferably about 25%; and 55–85% nickel, preferably about 75%. This combination exhibits a high degree of conductivity before the augmentative replacement reaction step and has certain advantages in reducing the rate of reaction with zinc because an enlarged electrically conductive surface area is presented to the metal salt solution while a relatively smaller proportion of that area is the quite reactive zinc powder. As a result, a high quality conductive coating is formed which has a very high degree of adhesion even though the reaction involves zinc and copper which are quite displaced from one another in the activity series of the metals. The presence of the nickel reduces this vigorous reaction. The resulting conductor system also has the advantage of being stable in the presence of high degrees of moisture. When iron is used as the reactive metal, it tends to rust and form an unsightly deposit on the surface of the conductor and in areas immediately adjacent to the conductor on the substrate. In extreme cases, the resistance between closely spaced conductors can actually be reduced. In the nickel-zinc system, the zinc does not rust and very little corrosion product is formed, even in very high moisture environments.

It further has been found that by raising temperatures at which the augmentative replacement is conducted to about 65° C. and by adding a small amount of nitric acid to the copper sulfate solution, improved coating can be achieved with nickel-zinc systems, which improved coating which is primarily manifested by a reduced resistivity of the conductor. It is believed that the nitric acid probably acts to clean the passivated surface of the nickel allowing it to enter into the replacement reaction rather than merely be coated.

Another preferred metal powder mixture contains: about 20–35% copper powder, preferably about 25–30%; about 15–30% tin powder, preferably about 20–25%; about 10–25% aluminum powder, preferably about 15–20%; and about 25–40% iron powder; preferably about 30–35%. Improved adhesion as well as increased conductivity can also be obtained by pre-dipping a substrate inked with such a combination of metal powders in a solution of alkali, such as sodium hydroxide. The caustic solution tends to attack the surface of the polymeric binder exposing more of the metal particles at the surface as well as sensitizing the aluminum. As a result, when the cured ink is dipped into an acidic copper sulfate solution, some plating also occurs on the aluminum due to an electrochemical reaction before the acid tends to anodize and passivate the aluminum. At this point, the iron, and to a much lesser extent the tin, are dissolved in the copper sulfate solution to form iron or tin sulfate while copper plates out on all of the exposed metal at the surface of the polymer. The conductivity can be varied in the above combination by increasing the percentage of iron and decreasing the other metals proportionally. The amount of tin can be reduced but this also reduces the solderability of the resulting conductor. Reducing the amount of copper and increasing the amount of aluminum or the total amount of the other materials in the cured ink will tend to reduce adhesion of ink to the substrate.

The techniques of the present invention can also be used to interconnect the conductive pathways with thick-film resistors, while eliminating or changing the order of high temperature curing operations and thereby enhancing solderability markedly.

Figure 3:
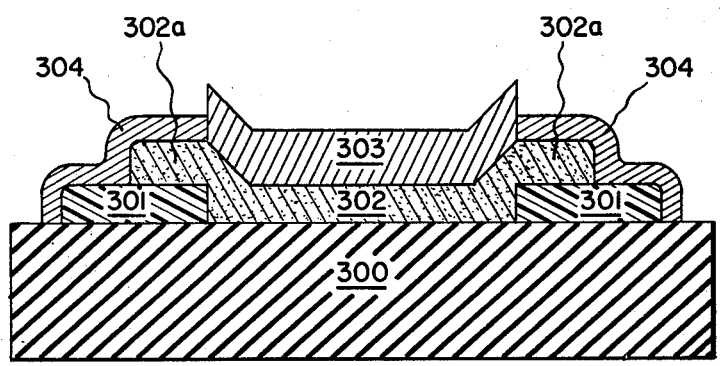
FIG. 3 is a cross-section of a resistor-conductor terminal in accordance with the present invention.

In conventional thick-film resistor systems, conductors are first formed and the resistor overlaps the conductor patterns at the terminations. These connections can be prepared according to the present invention by applying the ink composition to the substrate followed by drying and, if desired, curing the polymer. A polymer resistor is then printed or otherwise placed on the substrate in the conventional fashion in such a way that it overlaps the conductor pattern ink at least at some areas. The polymer resistor ink is dried and, if desired, cured. As in conventional systems, an insulating overcoating layer is printed over all of the resistor material except that, in the present invention, the area of the terminations is not coated. The overcoat insulation layer, and to the extent not previously affected, the conductor pattern and resistor, and then cured. The augmentative replacement reaction in accordance with the present invention is then performed. The resulting structure is shown in FIG. 3. The substrate 300 has a cured conductor pattern ink 301 on it. The substrate 300 is also coated with the resistive material 302 which in turn is overcoated with an insulation layer 303 in those areas of resistive material 302 other than where connections to conductors are desired. Note that at such areas, resistive material portions 302a overlie ink 301. The augmentative replacement reaction has caused a layer of contiguous copper 304 to be formed over the conductor ink pattern 301 and at least resistive material portions 302a. The metal powder in the conductor pattern ink 301 has been replaced at its surface with a contiguous layer 304 of copper being formed at the surface of the conductor pattern. In addition, some of the metal powder is dissolved, causing plating to occur by ordinary electroplating processes on the surface of the unprotected resistor termination. This then causes a chemically bonded copper layer 304 to contact both the conductor patttern 301 and the resistor material 302. The termination is of very high quality and prevents an insulator from forming between the resistor and the conductor, at a later time.

If desired, the polymer resistor ink can be loaded with a small weight percent of a metal powder which can take part in the augmentative replacement reaction, for example, iron or zinc. Since this powder is readily oxidized on the surface, it acts only as an inert filler in terms of affecting the resistance of the cured polymer resistor material. However, when the augmentative replacement reaction is effected, some of the metal powder will be dissolved (oxidized) with a copper layer forming on both the surface of the metal powder and on the surface of the resistor material. In this embodiment, there is no necessity for electroplating action to be provided by the conductor pattern ink because it is provided by the resistor material itself. This procedure can be utilized with higher resistivity terminations to insure that adequate electroplating action occurs over the entire portion of the resistor material. If this was not done, the high resistivity could cause a voltage drop which would cause most of the plating to occur nearest to the conductor end with very little plating at a distance from the conductor end.

Figure 4:
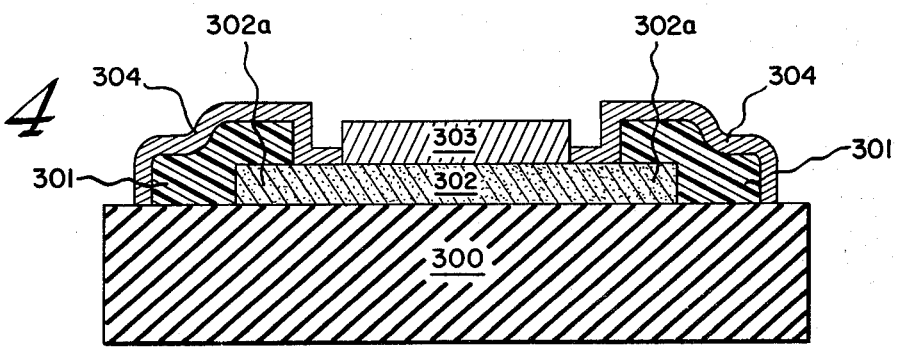
FIG. 4 is a cross-section of a second resistor-conductor terminal in accordance with the present invention.

FIG. 4 shows an alternative structure in which the resistor layer 302 is printed before the conductor pattern ink 301. This structure is typical of a multiconductor layer structure where a first conductor layer would be applied, followed by printing the resistor layer 302 and insulating overcoat 303 which can act as a dielectric to provide crossovers between first and second conductor layers. Finally, the second conductor layer 301 is printed and the augmentation reaction effected, so as to form a contiguous copper layer 304 which contacts resistor 302. By this means, a multilayer circuit with embedded resistors and terminations if formed. It should be noted that; in each case of resistor termination, the curing steps, which may be high temperature steps, occur before the last augmentation reaction plating step. This sequence results in the last contiguous copper layer being prevented from exposure to high temperatures. This last layer is thus new and unoxidized copper, which can be readily soldered to.

Various components such as integrated circuit packages and transistors can be interconnected with the conductive paths by the methods of the present invention. This is effected by mounting the component parts such that their connection pads make contact with the conductor ink pattern preferably, but not necessarily, before curing. This procedure is successful because the augmentative replacement reaction causes the finely divided metal to be dissolved (oxidized) at points along the conductor pattern resulting in copper or other metal being deposited at conducting points adjacent to the dissolved metal. If the component lead is embedded in a cured conductor pattern ink and the augmentative replacement reaction takes place, a copper layer will form on both the conductor pattern and on the component lead. Leads made out of KOVAR ® alloy are especially attractive because the alloy contains iron which will actually participate in the replacement reaction per se. In either case, the result is a contiguous layer of copper along the surface of the conductor as well as the surface of the component lead.

Positioning the component in an uncured polymer ink pattern requires some degree of initial adhesion to be obtained in order to hold the component in place and it has been found that the uncured polymer ink makes a relatively good wet adhesive. When the ink is cured, good adhesion is obtained as a result of using the polymer as a glue to hold the components to the substrate. Such adhesion can be enhanced by printing an area underneath the component whose only purpose would be to hold the component in place.

Of particular interest to this invention are those applications where a plastic housing becomes an electronic substrate. One example is electronic toys where it is desirable that no substrate be required in order to reduce costs. Typically the electronic components are mounted directly on the plastic which forms the body of the toy. By pad flexographic printing techniques, the uncured polymer ink of the present invention can be printed on the plastic and cured at relatively low temperature so that the plastic does not melt. Good connections can be obtained to the electronic components by then effecting the augmentative replacement reaction described above.

Another application of this invention which warrants special mention is the area of accommodation of thermal expansion displacements. Because the polymer can be relatively flexible and the copper coating obtained is relatively ductile and quite thin, large mismatches in thermal expansion can be accommodated without breaking the electrical connection. It is also noteworthy that the solderless interconnect technique described above is essentially self-aligning in that as long as some degree of contact is made between the conductor and the component lead, a contiguous layer will be formed so as to strengthen the conductivity of that connection.

Where a component is broken or otherwise removed from the substrate, a new component can be mounted by the techniques of this invention or alternate technology. For example a new component can be mounted by conventional conductive epoxies or conductive polymer techniques which, while more expensive than the procedure set forth in this invention, require that they be employed only at those areas where the repair is needed.

In order to further illustrate the present invention, various examples are set forth below. It will be appreciated that these examples are set forth in order to further illustrate the invention, but are not intended to limit it. Further, it should be appreciated that all parts and percentages are by weight and all temperatures in degree Celsius throughout this specification and claims unless otherwise indicated.

EXAMPLE 1

A low-cost conductor system was prepared by printing 5×0.05 inch conductor patterns (in a labyrinth pattern) using a semiautomatic screen printing machine and 165 mesh stainless steel screens on a glass substrate. The printing ink contained 77% iron powder, 12% polyester (commercially available GE polyester 73517), 1% of T-butyl-perbenzoate catalystand 11% diethylene glycol monobutyl ether solvent. The patterns were dried by subjection to a temperature of 120° C. for 20 minutes and then cured by baking at a temperature of 150°–180° C. for 10–30 minutes. The conductivity of the resulting cured polymer ink was found to be about 30 Kohm per square for a 1 mil thick deposit. The patterned substrate was then immersed into a 133 ml aqueous solution containing 40 grams of copper sulfate pentahydrate and 7 grams of concentrated sulfuric acid which was maintained at about 55° C. After 5 minutes, the resistance was determined to be 0.3 ohms, i.e., 3.00 milliohms/sq. In comparison, the best gold thick-film conductors fired on ceramic substrates are 1 to 2 miliohms/sq. and leach on soldering. Commercially available solderable conductors are in the 10–30 milliohm/sq. Category and typical silver-loaded polymer conductors are about 40 milliohms/sq. The conductive paths of the present example were hand soldered and reflow soldered, using standard eutectic tin-lead solder, without evidence of leaching.

EXAMPLE 2

Substrates were prepared with 0.1×0.1 inch conductive patterns, according to the procedure of Example 1. Abrasive rubbing was employed in one experiment, and in the other case there was no abrasion. Abrasive rubbing was performed by use of a linen cloth, previously dipped in anhydrous copper sulfate powder and silica powders; the substrate was placed in a shallow, flat pan (containing the acid copper sulfate solution of Example 1) and rubbed with the powder-bearing cloth. Both conductors were tested by soldering a wire to the conductor path and a pulling force was applied perpendicular to the plane of the substrate. In the case of the abrasive-rubbed conductor, the pull test exceeded 10 lbs. while the other conductor gave pull test results which varied form 0.5 to 2 lbs. A 10–16 lb. pull test is usually associated with high quality gold thick film conductors fired on ceramic substrates and would represent 32,000 g's for a 16 pin dip soldered to standard conductor pads.

EXAMPLE 3

Example 2 was repeated except that the ink composition contained about 26.5% iron, 13.2% aluminum, 19.8% tin, 23.8% copper, 9.9% polyester, and 6.6% diethylene glycol monobutyl ether, all of the metals being −325 mesh and a 325 mesh screen was used for the printing step. Additionally, before effecting the augmentative replacement reaction, the printed substrate was dipped into a 10% aqueous solution of sodium hydroxide. Adhesion of soldered wires to a 0.1×0.1 inch square pulled at an angle of 90° to the substrate was greater than 10 lbs. and the resistance was 0.015 to 0.030 ohms/sq.

EXAMPLE 4

Example 3 was repeated except that the ink contained 48.2% of −325 mesh nickel, 32.1% of −325 mesh zinc, 11.8% polyester and 7.8% diethylene glycol monobutyl ether and the dipping in caustic was omitted. Adhesion of soldered wires to 0.1×0.1 inch squares pulled at an angle of 90° to the substrate was greater than 10 lbs. and the resistance was 0.008–0.015 ohms/sq.

EXAMPLE 5

Example 4 was repeated except after curing the polymer ink, a resistor test smear of brown tungsten oxide was applied over the substrate and terminated at each end by overlapping the ink. A piece of tape was used as an insulator in the center of the test smear. After effecting the augmentative replace reaction, it was noted that the conductor at the exposed brown tungsten oxide had a layer of copper thereon and no detectable termination resistance could be measured.

EXAMPLE 6

A low cost conductor system was prepared which exhibited exceptional adhesion in the presence of high humidity. A conductor pattern was printed on porcelanized steel through a 200 mesh stainless steel screen. The ink consisted of 9% Epon 828 Epoxy Resin with curing agent, 20% Zinc (−325 mesh), 62% Nickel (−325 mesh), and 8.2% Ethylene Glycol Monobutyl ether solvent. The metal powders were first mixed and sifted through a 400 mesh screen. The epoxy curing agent and 60% of the solvent were mixed and the metal powders added. The additional solvent was added to the mix to adjust the viscosity to approximately 65,000 cps. Connector and solder pads (0.1×0.1 inch) were printed on porcelanized steel blanks. The ink was dried for 10 minutes in a low CFM room temperature environment. The blanks were then cured for 15 minutes at 200° C. Resistivity was initially measured at 7 to 10 milliohm per square. Pull test was greater than 10 pounds for the 0.1×0.1 inch pads. The printed blanks were then subjected to 96% relative humidity for 100 hours. Pull test was greater than 10 pounds and resistivity was unchanged. Insertion of the part into a mating connector 16 times was accomplished without undue wear on the connector edge.

EXAMPLE 7

A solderless interconnect to an 80 pad chip carrier was achieved using augmentative replacement processing. The chip carrier was prepared by sanding the gold plating from the pad area to expose the underlying KOVAR® leads. The ink was prepared by mixing 11% GE 73517-4 polyester (catalyzed with 1% dicumyl peroxide), 3.4% butyl carbitol, 45% iron powder (−325 mesh), 39% tin powder (−325 mesh) and 0.4% calcium silicate. The ink was spread, with a spatula, on a 50×75 mm glass microscope slide. The 80 pad chip carrier was placed in the uncured ink. The ink, with chip carrier, was dried for 20 minutes at 110° C., then cured for 15 minutes at 200° C. The slide was then dipped, for 5 minutes, in the copper sulfate solution of Example 1. Both conductor ink and the sides of the pads were plated with copper. The inside of the chip barrier was probed for conductivity to the outside conductor and satisfactory connection to each of the 80 pins was found.

EXAMPLE 8

Test plating and adhesion samples were fabricated by mixing an ink consisting of 8.3% Epun 828 and curing agent, 8% ethylene glycol monobutyl ether solvent, 21% −325 mesh zinc powder and 63% −325 mesh nickel powder. The ink was spread on 1×3 inch slips of phenolic laminate, dried for 10 minutes at 150° C. and then cured for 20 minutes at 180° C. The cured phenolic substrate was then dipped in a 133 ml solution of 40 gms of copper sulfate, 7 gms of sulfuric acid and 1.5 gms of nitric acid, heated to 66° C., for 5 minutes. The result was a copper coated phenolic substrate with conductivity of 10 milli-ohm/square and yield adhesion stress of greater than 1000 lb/sq inch.

EXAMPLE 9

A plating bath for plating cadmium was made up by mixing 1 molar solution of cadmium chloride and 10 gm/liter of hydrochloric acid. Conductor ink was prepared as in Example 8 and spread on 1×3 inch glass slides, dried for 10 minutes at 150° C. and then cured for 20 minutes at 180° C. The test slides were immersed in the cadmium chloride bath for 15 minutes. Resistivity was measured at 1.0 ohms/square, which is approximately unchanged from the value prior to immersion in the bath. A change on the surface from dark gray to light-silver-grey crystalline appearance, was observed. The resistivity of the plated samples remained the same upon heating to 200° C. for 1 hour, while the unplated sample, under the same conditions, exhibited increased resistivity by a factor of ten.

EXAMPLE 10

In this example a substrate was prepared and solder dipped. A test pattern (containing 5 lines, each ½ inch long, with each line being 10 milli-inch wide and having 10 milli-inch spaces therebetween, and 0.1×0.1 pads and a 100 square test conductor) was printed using a 200 mesh stainless steel screen and using the ink composition of Example 8. This pattern was printed on a 2×2 inch alumina substrate, dried for 10 minutes at 150° C. and then cured for 20 minutes at 180° C. The substrate was then immersed in the bath of Example 8 for a period of 5 minutes. The substrate was then immersed in rosin solder flux liquid and dipped for 5 seconds in a 230° C. 60/40 Pb/Sn solder pot. The substrate was slowly withdrawn from the molten solder, cooled and then defluxed in a spray of tirchloroethane. The solder covered all of the conductor and showed no bridging across the 10 mil separated runs. The 100 square conductor test conductor had a measured resistance of 0.2 ohms, or 2 milli ohms/square.

EXAMPLE 11

A flexible conductor system was fabricated by the following procedure: 20 grams of iron powder (−325 mesh) was mixed with 4.2 gms of Naz-dar MY170 mixing base and 1 gm Naz-dar MY180 thinner. The ink was spread on a 3 mil thick MYLAR ® sheet and the ink was dried at 100° F. for 3 hours. The Mylar substrate was dipped in the copper sulfate solution of Example 1 for 5 minutes. In this manner, a flexible copper conductor was obtained with resistivity of 6 milli-ohm per square.

Various changes and modifications can be made in the process and products of this invention without departing from the spirit and scope thereof. The various embodiments set forth herein were for purpose of further illustrating the invention but were not intended to limit it.

What is claimed is:

1. A method for forming an electrical conductor in desired areas of a substrate, which comprises the steps of: applying a desired design to said substrate with an ink composition comprising a finely divided metallic powder having at least a first metal therein and a curable polymer; at least partially curing said curable polymer to cause volumetric shrinkage thereof; adjusting the amount of the finely divided powder to be about 60-80% by volume of said ink composition after the ink is at least partially cured; and contacting the at least partially cured ink composition of the desired design with a metal salt solution of a second metal in which the second metal cation is more noble that at least the first metal of finely divided powder and the anion of said metal salt forms soluble salts with both said cation and at least the first metal of said finely divided powder, to cause said second metal of said metal salt solution to plate out as a contiguous layer on the surface of said ink composition and with a volume of said second metal on said surface greater than the volume of the metal of said powder removed from said surface.

2. The method of claim 1, wherein said finely divided metal has a particle size of less than about 50 microns.

3. The method of claim 2, wherein said finely divided metallic powder has a particle size of about 3-25 microns.

4. The method of claim 3, wherein said finely divided metallic powder has a particle size of less than 10 microns.

5. The method of claim 1, wherein said polymer is adapted to thermally cure at about 140°-200° C.

6. The method of claim 1, wherein said finely divided metallic powder is about 70% by volume.

7. The method of claim 1, further including the step of drying and curing said ink composition before contacting the cured ink composition with said metal salt solution.

8. The method of claim 1, in which said metal salt solution is an inorganic solution containing 0.1 molar to saturation of said metal salt.

9. The method of claim 8, wherein said metal salt solution is an aqueous solution containing about 0.5-2.0 molar metal salt.

10. The method of claim 9, wherein said metal salt solution is 1 molar.

11. The method of claim 1, wherein said finely divided metallic powder comprises iron.

12. The method of claim 11, wherein said finely divided metallic powder comprises about 25-40% by weight of iron, about 10-25% by weight of aluminum, about 15-30% by weight of tin and about 20-35% by weight of copper.

13. The method of claim 12, wherein said finely divided metallic powder comprises about 30-35% by weight of iron, about 15-20% by weight of aluminum, about 20-25% by weight of tin and about 25-30% by weight of copper.

14. The method of claim 1, wherein said finely divided metallic powder comprises about 15-45% by weight of zinc and about 55-85% by weight of nickel.

15. The method of claim 14, wherein said finely divided metallic powder comprises about 25% by weight of zinc and about 75% by weight of nickel.

16. The method of claim 1, in which a third metal is applied to said contiguous layer of said second metal.

17. The method of claim 16, wherein said third metal is tin.

18. The method of claims 1 or 17, in which said second metal is copper.

19. The method of claim 1, wherein the surface of said at least partially cured polymer is abraded not later than the step of contacting with said metal salt solution.

20. The method of claim 19, wherein said metal salt solution is an aqueous copper sulfate solution and wherein said surface is abraded with an amount of copper sulfate beyond the solution saturation amount.

21. The method of claim 1, wherein a resistive material is applied on said substrate in contact with said at least partially cured polymer before the step of contacting said substrate with said metal salt solution.

22. The method of claim 21, in which said resistive material is a thick film resistor and said ink composition is applied to said substrate so as to overlap a portion of said resistor to form an electrical junction therebetween as a consequence of said contacting.

23. The method of claim 21, wherein said resistive material is a thick film resistor and is applied to said substrate so as to partially overlap a portion of said at least partially cured curable polymer to form an electrical junction therebetween as a consequence of said contacting.

24. The method of claim 23, wherein said thick film resistor contains a metal which is less noble than said metal cation of said metal salt solution.

25. The method of claim 1, wherein an electrically conductive member is positioned in said polymer before said polymer is completely cured.

26. The method of claim 1, wherein said ink composition includes a solvent.

27. The method of claim 26, wherein said solvent has a viscosity of about 15,000–200,000 centipoises at room temperature.

28. The method of claim 27, wherein said solvent has a viscosity of 50,000–150,000 centipoises at room temperature.

29. The method of claim 26, further including the step of drying and curing said ink composition before contacting the cured ink composition with said metal salt solution.

30. The method of claim 29, wherein said curable polymer is a polyester thermally curable at about 150°–180° C.; said solvent is a diethylene glycol monobutyl ether; and wherein said drying is effected at about 70°–150° C. for about 0.1–1.0 hour.

31. The method of claim 30, wherein said drying is effected at about 110°–130° C. for about 0.25–0.50 hour.

32. The method of claim 26, wherein said polymer is adapted to thermally cure at about 140°–200° C.

33. The method of claim 26, wherein said finely divided metallic powder is about 70% by volume.

34. A method for forming an electrical conductor in desired areas of a substrate, comprising the steps of:
(a) adhering to said substrate in a desired pattern a polymer containing a finely-divided powdered metal, said finely-divided powdered metal comprising about 60–80% by volume of the total of said polymer and said powdered metal; and
(b) replacing a portion of said finely-divided powdered metal with another metal more noble than said powdered metal.

35. The method of claim 34, wherein step (a) comprises the steps of: applying to said substrate a desired pattern of an ink composition comprising said finely-divided powdered metal and a curable polymer; and at least partially curing said curable polymer to cause a volumetric shrinkage thereof.

36. The method of claims 34 or 35, wherein step (b) comprises the step of contacting said polymer with a solution of a salt of said another metal for sufficient time such that said portion of said finely-divided powdered metal enters into said solution from said polymer, is replaced therein with said another metal, and a contiguous layer of an additional quantity of said second metal is formed upon a surface of said polymer.

37. The method of claim 36, wherein said ink composition includes a solvent.

38. The method of claim 37, wherein said solvent has a viscosity of about 15,000–200,000 centipoises at room temperature.

39. The method of claim 38, wherein said solvent has a viscosity of 50,000–150,000 centipoises at room temperature.

40. The method of claim 37, wherein said polymer is adapted to thermally cure at about 140°–200° C.

41. The method of claim 37, wherein said finely-divided powdered metal is about 70% by volume.

42. The method of claim 37, further including the step of drying and curing said polymer before replacing said portion of said finely-divided powdered metal with said another metal.

43. The method of claim 42, wherein said curable polymer is a polyester thermally curable at about 150°–180° C.; said solvent is a diethylene glycol monobutyl ether; and wherein said drying is effected at about 70°–150° C. for 0.1–1.0 hour.

44. The method of claim 43, wherein said drying is effected at about 100°–130° C. for about 0.25–0.50 hour.

45. The method of claim 36, wherein said metal salt solution is an organic solution containing 0.1 molar to saturation of said metal salt.

46. The method of claim 45, wherein said metal salt solution is an aqueous solution containing about 0.5–2.0 molar metal salt.

47. The method of claim 46, wherein said metal salt solution is 1 molar.

48. The method of claim 36, wherein said finely-divided powdered metal comprises iron.

49. The method of claim 48, wherein said finely-divided powdered metal comprises about 25–40% by weight of iron, about 10–25% by weight of aluminum, about 15–30% by weight of tin and about 20–35% by weight of copper.

50. The method of claim 49, wherein said finely-divided powdered metal comprises about 30–35% by weight of iron, about 15–20% by weight of aluminum, about 20–25% by weight of tin and about 25–30% by weight of copper.

51. The method of claim 36, wherein said finely divided powdered metal comprises about 15–45% by weight of zinc and about 55–85% by weight of nickel.

52. The method of claim 51, wherein said finely divided powdered metal comprises about 25% by weight of zinc and about 75% by weight of nickel.

53. The method of claim 36, wherein a third metal is applied to said additional quantity of said another metal.

54. The method of claim 53, wherein said third metal is tin.

55. The method of claim 54, wherein said another metal is copper.

56. The method of claim 36, wherein said another metal is copper.

57. The method of claim 56, wherein said metal salt solution is an aqueous copper sulfate solution and wherein said polymer is abraded with an amount of copper sulfate beyond the solution saturation amount.

58. The method of claim 36, wherein the surface of said polymer is abraded not later than the step of contacting with said metal salt solution.

59. The method of claim 36, wherein a resistive material is applied to said substrate in contact with said polymer, prior to the step of contacting said substrate with said metal salt solution.

60. The method of claim 59, wherein said resistive material is a thick-film resistor and said ink composition is applied to said substrate so as to overlap a portion of said resistor to form an electrical junction therebetween as a consequence of said contacting.

61. The method of claim 59, wherein said resistive material is a thick-film resistor and is applied to said substrate so as to partially overlap a portion of said polymer to form an electrical junction therebetween as a consequence of said contacting.

62. The method of claim 61, wherein said thick film resistor contains a metal which is less noble than the cation of said another metal.

63. The method of claim 36, wherein an electrically conductive member is positioned in said polymer before said polymer is completely cured.

64. The method of claim 34, wherein said finely divided powdered metal has a particle size of less than about 50 microns.

65. The method of claim 64, wherein said finely divided powdered metal has a particle size of about 3-35 microns.

66. The method of claim 65, wherein said finely divided powdered metal has a particle size of less than 10 microns.

67. A method for providing selected areas of greater electrical conductivity on the surface of a substrate of lesser electrical conductivity, comprising the steps of:
(a) applying only to said selected areas a coating of a polymeric insulation material containing a dispersion of powdered metal of about 60-80% by volume of said coating; and
(b) contacting said coating with a solution containing a metal more noble than the effective ingredients of said powdered metal and forming a film of the more noble metal contiguous with the surface of said polymeric insulating material, with a contiguous conductive film of said more noble metal overlying only the selected areas of said substrate.

68. The method of claim 67, wherein said coating further includes a solvent.

69. The method of claim 68, wherein said solvent has a viscosity of about 15,000-200,000 centipoises at room temperature.

70. The method of claim 69, wherein said solvent has a viscosity of 50,000-150,000 centipoises at room temperature.

71. The method of claim 68, wherein said polymeric insulating material is curable and undergoes volumetric shrinking upon curing.

72. The method of claim 68, wherein said polymeric insulating material is adapted to thermally cure at about 140°-200° C.

73. The method of claim 68, wherein said powdered metal is about 70% by volume.

74. The method of claim 68, further including the step of simultaneously drying and curing said coating before contacting said coating with said solution.

75. The method of claim 74, wherein said curable polymer is a polyester thermally curable at about 150°-180° C.; said solvent is a diethylene glycol monobutyl ether; and wherein said drying is effected at about 70°-150° C. for about 0.1-1.0 hour.

76. The method of claim 75, wherein said drying is effected at about 110°-130° C. for about 0.25-0.50 hour.

77. The method of claim 67, wherein said powdered metal has a particle size of less than about 50 microns.

78. The method of claim 77, wherein said powdered metal has a particle size of about 3-25 microns.

79. The method of claim 78, wherein said powdered metal has a particle size of less than 10 microns.

80. The method of claim 67, in which said metal solution is an inorganic solution containing 0.1 molar to saturation of a salt of said metal.

81. The method of claim 80, wherein said second metal salt solution is aqueous solution containing about 0.5-2.0 molar metal salt.

82. The method of claim 81, wherein said metal salt solution is 1 molar.

83. The method of claim 67, wherein said powdered metal comprises iron.

84. The method of claim 83, wherein said powdered metal comprises about 25-40% by weight of iron, about 10-25% by weight of aluminum, about 15-30% by weight of tin and about 20-35% by weight of copper.

85. The method of claim 84, wherein said powdered metal comprises about 30-35% by weight of iron, about 15-20% by weight of aluminum, about 20-25% by weight of tin and about 25-30% by weight of copper.

86. The method of claim 67, wherein said powdered metal comprises about 15-45% by weight of zinc and about 55-85% by weight of nickel.

87. The method of claim 86, wherein said powdered metal comprises about 25% by weight of zinc and about 75% by weight of nickel.

88. The method of claim 67, further comprising the step of applying another metal to the conductive film of said more noble metal.

89. The method of claim 88, wherein said another metal is tin.

90. The method of claim 67 or 89, wherein said more noble metal is copper.

91. The method of claim 67, wherein the surface of said coating is abraded not later than the step of contacting with said metal solution.

92. The method of claim 91, wherein said metal solution is an aqueous copper sulfate solution and wherein said coating is abraded with an amount of copper sulfate beyond the solution saturation amount.

93. The method of claim 67, wherein a resistive material is applied on said substrate in contact with said coating before the step of contacting said coating with said metal solution.

94. The method of claim 93, wherein said resistive material is a thick film resistor and said coating is applied to said substrate so as to overlap a portion of said resistor to form an electrical junction therebetween as a consequence of said contacting.

95. The method of claim 93, wherein said resistive material is a thick film resistor and is applied to said substrate so as to partially overlap a portion of said coating to form an electrical junction therebetween as a consequence of said contacting.

96. The method of claim 95, wherein said thick film resistor contains another metal which is less noble than said second metal.

97. The method of claim 67, wherein an electrically conducting member is positioned in said coating before said coating is completely cured.

* * * * *